(12) United States Patent
Wang et al.

(10) Patent No.: US 10,541,695 B2
(45) Date of Patent: Jan. 21, 2020

(54) FAST-LOCKING PHASE LOCKED LOOP AND FAST LOCKING METHOD

(71) Applicant: ANPEC ELECTRONICS CORPORATION, Hsinchu (TW)

(72) Inventors: Yuan-Hung Wang, Miaoli County (TW); Jing-Min Chen, Hsinchu (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 7 days.

(21) Appl. No.: 16/122,952

(22) Filed: Sep. 6, 2018

(65) Prior Publication Data

US 2019/0363721 A1    Nov. 28, 2019

(30) Foreign Application Priority Data

May 25, 2018   (TW) .............................. 107117946 A

(51) Int. Cl.
*H03L 7/099*    (2006.01)
(52) U.S. Cl.
CPC .................... *H03L 7/099* (2013.01)
(58) Field of Classification Search
CPC ...................................... H03L 7/099
USPC ......................................... 331/18
See application file for complete search history.

(56) References Cited

U.S. PATENT DOCUMENTS

| | | | |
|---|---|---|---|
| 9,680,480 B1* | 6/2017 | Fredenburg | H03L 7/093 |
| 2005/0083137 A1* | 4/2005 | Lee | H03L 7/085 331/16 |
| 2005/0226357 A1* | 10/2005 | Yoshimura | H03L 7/099 375/376 |
| 2005/0258906 A1* | 11/2005 | Su | H03L 7/099 331/10 |
| 2015/0222280 A1* | 8/2015 | Allan | H03L 7/083 327/157 |

* cited by examiner

*Primary Examiner* — Joseph Chang
(74) *Attorney, Agent, or Firm* — Li & Cai Intellectual Property (USA) Office

(57) ABSTRACT

A fast-locking phase locked loop and a fast locking method are provided. The fast locking method includes dividing a frequency of an oscillation signal by a preset divisor to output a divided signal, detecting a frequency difference between the divided signal and a reference signal, tracking whether a divided frequency of the divided signal falls within a locked frequency range or not, if not, tracking the divided frequency, and if yes, locking the divided frequency, detecting a divided phase difference between a divided phase of the divided signal and a reference phase of the reference signal, recording the phase difference as a tracking reference phase difference, tracking a next divided phase according to the tracking reference phase difference, and determining whether the divided phase falls within a locked phase range, and if not, tracking the divided phase, and if yes, locking the divided phase.

8 Claims, 5 Drawing Sheets

FAST-LOCKING PHASE LOCKED LOOP AND FAST LOCKING METHOD

CROSS-REFERENCE TO RELATED PATENT APPLICATION

This application claims the benefit of priority to Taiwan Patent Application No. 107117946, filed on May 25, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a phase locked loop, and more particularly to a fast-locking digital phase locked loop.

BACKGROUND OF THE DISCLOSURE

With the advancement of electronic technology, electronic products have become indispensable tools in people's lives. Taking communication products used for information exchange as an example, exchanging information with the external world through communication products are already necessary daily tasks in people's lives. The phase-locked loop device is one of the most common devices in electronic communication products, which is usually used to provide a periodic output signal with accurate phase. However, when the conventional digital phase-locked loop performs phase-locking, the rising edge of the reference signal is usually aimed for aligning the rising edge of the signal waveform to be phase-locked with the rising edge of the reference waveform. Therefore, in the case of a large phase difference, the time from the start of phase locking to the determination of phase locking will be increased.

SUMMARY OF THE DISCLOSURE

In order to solve the above-mentioned shortcomings of the prior art, it is an object of the present disclosure to provide a fast-locking phase locked loop, including:

an oscillating circuit outputting an oscillating signal;

a divider coupled to the oscillating circuit, configured to divide the oscillating signal by a preset divisor to output a divided signal;

a phase frequency detector coupled to the divider, configured to receive a reference signal and the divided signal, and detect a frequency difference between a divided frequency of the divided signal and a reference frequency of the reference signal, wherein the phase frequency detector is configured to detect a phase difference between a rising edge of one of a plurality of divided waveforms of the divided signal and a rising edge of a corresponding reference waveform in the reference signal;

a frequency phase locking circuit coupled to the phase frequency detector, configured to receive the reference difference and track the divided frequency according to the reference difference, wherein when the divided frequency falls into a locking frequency range, the frequency phase locking circuit locks the divided frequency; and a phase recorder coupled to the phase frequency detector and the frequency phase locking circuit, wherein when the frequency phase locking circuit locks the divided frequency, the phase difference detected by the phase frequency detector serves as a tracking reference phase difference to be recorded in the phase recorder;

the frequency phase locking circuit is configured to track the other divided waveform after the divided waveform of the divided signal according to the tracking reference phase difference, and when the frequency phase locking circuit determines the divided phase of the divided waveform that is tracked falls within a locking phase range, the frequency phase locking circuit locks the divided phase that is tracked.

The present disclosure provides a fast locking method, which is suitable for the above-mentioned fast locking digital phase locked loop. The fast locking method comprises the following steps:

using an oscillating circuit to output an oscillating signal;

using a divider to divide a oscillating frequency of the oscillation signal by a preset divisor to output a divided signal;

using a phase frequency detector to detect a frequency difference between a divided frequency of the divided signal and a reference frequency of a reference signal;

using a frequency phase locking circuit to track whether the divided frequency falls within the locking frequency range, if not, continuously tracking the divided frequency, if yes, using the frequency phase locking circuit to lock the divided frequency;

using a phase frequency detector to detect a phase difference between a rising edge of one divided wave form of the divided signal and a rising edge of a corresponding reference waveform in the reference signal;

using a phase recorder to record the phase difference as a tracking reference phase difference;

using the frequency phase locking circuit to track, according to the tracking reference phase difference, one or more divided waveform after the divided waveform of the divided signal; and using the frequency phase locking circuit to determine whether the divided phase of the divided waveform that is tracked falls within a locking phase range, if not, continuously tracking the divided phase, if yes, using the frequency phase locking circuit to lock the divided phase that is tracked.

As described above, the present disclosure provides a fast-locking digital phase locked loop and a fast locking method thereof, by recording a phase difference between a waveform of a divided signal (for example, the first waveform) obtained by dividing the oscillating signal output from the oscillating circuit by a preset divisor and the corresponding waveforms of the reference signal to track the subsequent one or more waveforms of the divided signal, thereby reducing the phase locking time and achieving the effect of fast phase locking regardless of the phase difference.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the detailed description and the accompanying drawings, in which.

DETAILED DESCRIPTION OF THE EXEMPLARY EMBODIMENTS

Figure 1:
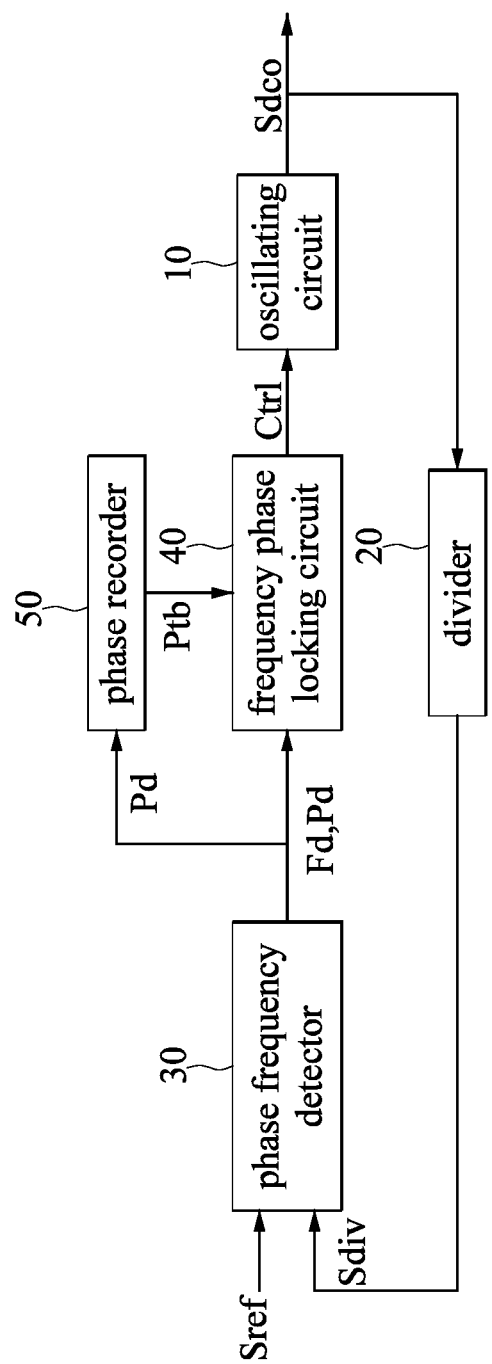
FIG. 1 is a block diagram of a fast-locking digital phase locked loop according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Various illustrative embodiments are described more fully hereinafter with reference to the accompanying drawings. However, the inventive concept may be embodied in many different forms and should not be construed as being limited to the illustrative embodiments set forth herein. Specifically, these exemplary embodiments are provided so that this disclosure will be thorough and complete, and the scope of the inventive concept will be fully conveyed by those skilled in the art. In the figures, like numerals are used to indicate like elements.

It should be understood that the terms "first", "second", and the like may be used to describe various parts, elements, components or portions, but these parts, elements, components or portions are not limited by these terms. These terms are only used to distinguish one element, part, component, or portion from another element, part, component, or portion. Thus, a first element, a first part, a first component, or a first portion discussed hereinafter may be termed a second element, a second part, a second component, or a second portion, etc., and the terms "third", "fourth" and so on., without departing from the teachings of the present application.

Reference is now made to FIG. 1, which is a block diagram of a fast-locking digital phase locked loop according to a first embodiment of the present disclosure. As shown in FIG. 1, a fast-locking digital phase locked loop can include an oscillating circuit 10, a divider 20, a phase frequency detector 30, a frequency phase locking circuit 40, and a phase recorder 50. The phase frequency detector 30 and the oscillating circuit 10 are both coupled to the phase recorder 50, the frequency phase locking circuit 40, and the divider 20. The phase recorder 50 is coupled to the frequency phase locking circuit 40.

First, the oscillating circuit 10 outputs an oscillating signal Sdco. When the divider 20 receives the oscillating signal Sdco from the oscillating circuit 10, the divider 20 divides the oscillating frequency of the oscillating signal Sdco by a preset divisor value to output the divided signal Sdiv having a divided frequency. When the phase frequency detector 30 receives a reference signal Sref and the divided signal Sdiv, the phase frequency detector 30 detects a frequency difference Fd between the divided frequency of the divided signal Sdiv and a reference frequency of the reference signal Sref. It should be understood that the oscillating frequency has a certain magnification relationship with the reference frequency, and the magnification is associated with the preset divisor value.

The frequency phase locking circuit 40 receives the reference difference Fd and track the divided frequency according to the reference difference Fd. When the divided frequency of the divided signal Sdiv falls into a locking frequency range, the frequency phase locking circuit 40 stops the frequency tracking operation and locks the divided frequency. When the frequency phase locking circuit 40 locks the divided frequency, the phase frequency detector 30 can detect a phase difference Pd between a divided phase of the divided signal Sdiv and a reference phase of the reference signal Sref, and use the phase difference Pd as a tracking reference phase difference Ptb to be recorded in the phase recorder 50.

Further, the tracking reference phase difference Ptb recorded by the phase recorder 50 is output to the frequency phase locking circuit 40. The phase recorder 50 can directly track the divided phase of the divided signal Sdiv according to the tracking reference phase difference Ptb. When it is tracked that the divided phase of the divided signal Sdiv falls within the locking phase range, the phase tracking operation is stopped and the frequency phase locking circuit 40 locks the divided phase that is tracked.

Figure 2:
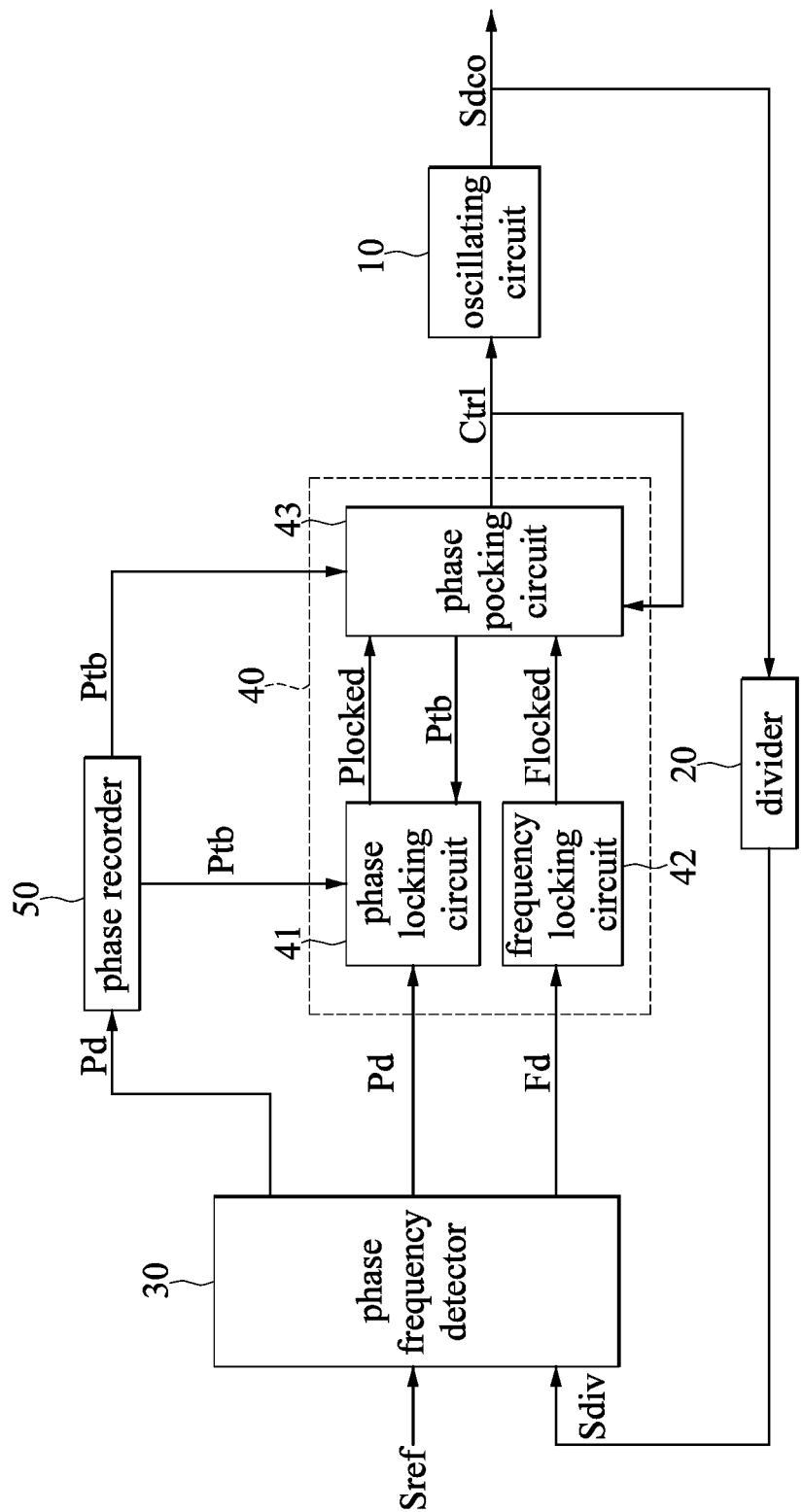
FIG. 2 is a first signal waveform diagram of a fast-locking digital phase locked loop of according to a second embodiment of the present disclosure.
Figure 3:
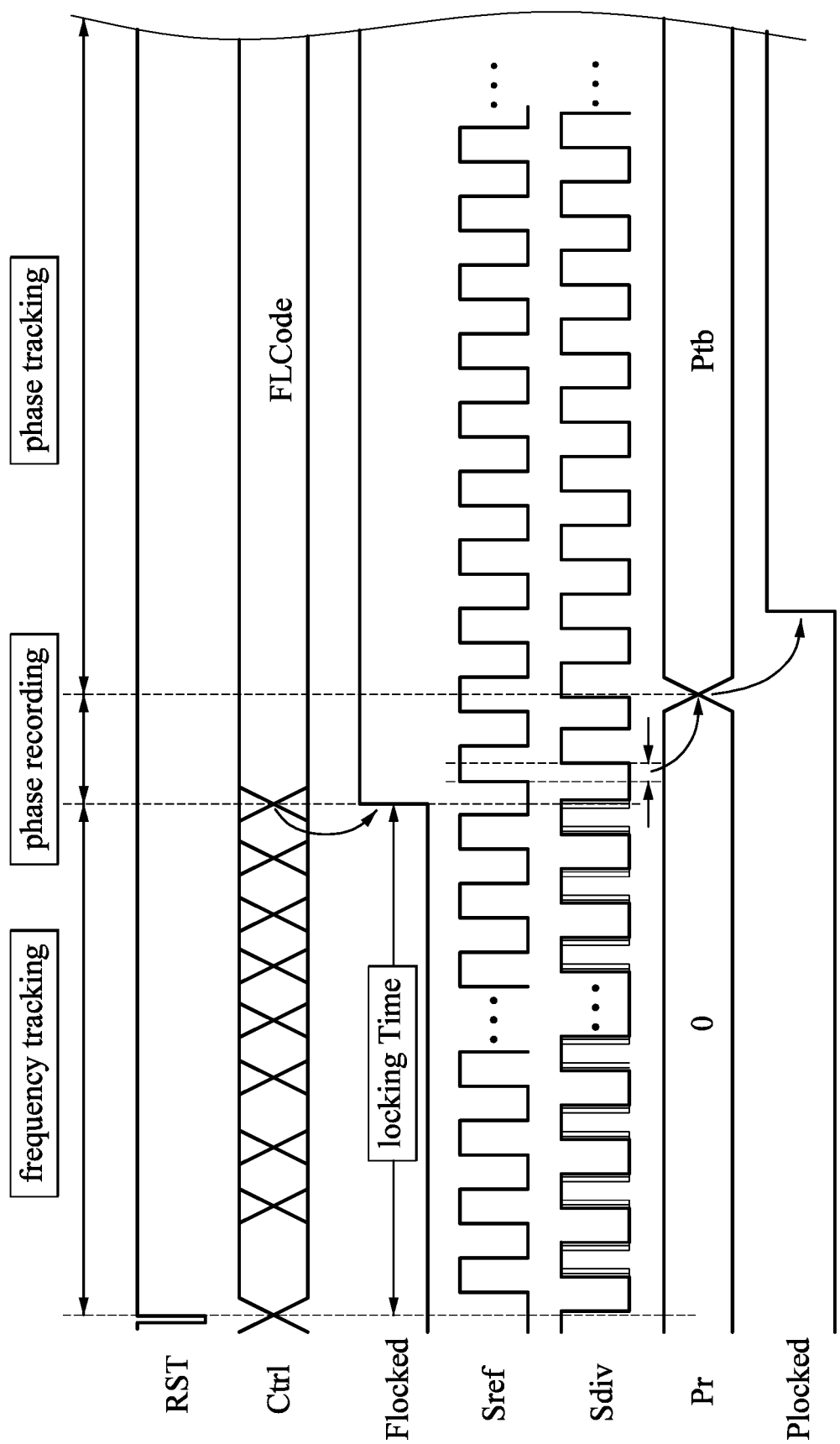
FIG. 3 is a second signal waveform diagram of a fast-locking digital phase locked loop of according to the second embodiment of the present disclosure.
Figure 4:
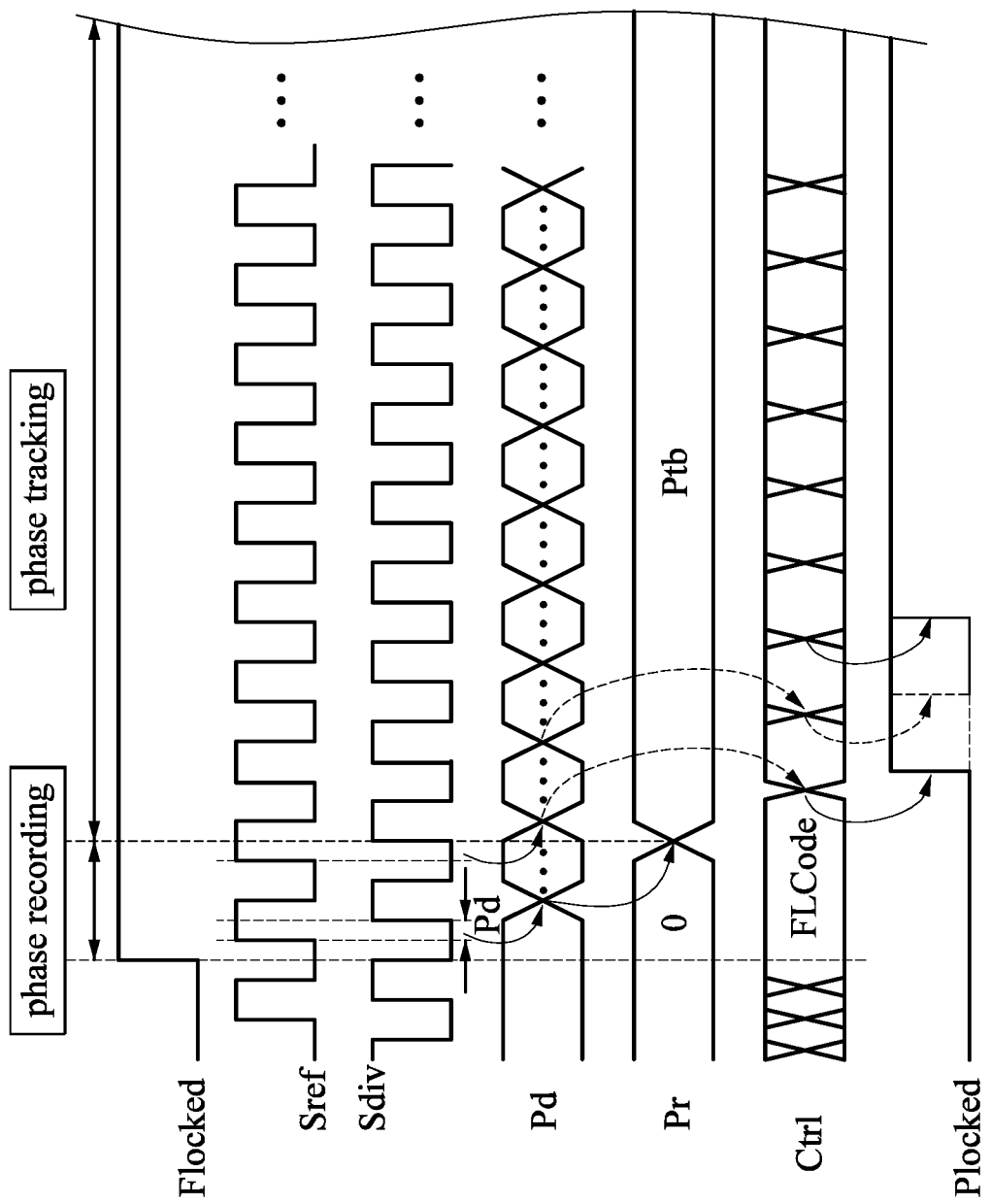
FIG. 4 is a block diagram of a fast-locking digital phase locked loop according to the second embodiment of the present disclosure.

Reference is now made to FIGS. 2, 3 and 4, FIG. 2 is a first signal waveform diagram of a fast-locking digital phase locked loop of according to a second embodiment of the present disclosure, FIG. 3 is a second signal waveform diagram of a fast-locking digital phase locked loop of according to the second embodiment of the present disclosure, and FIG. 4 is a block diagram of a fast-locking digital phase locked loop according to a second embodiment of the present disclosure. As shown in FIG. 2, the fast-locking digital phase locked loop can include an oscillating circuit 10, a divider 20, a phase frequency detector 30, a frequency phase locking circuit 40, and a phase recorder 50. The frequency phase locking circuit 40 includes a frequency locking circuit 42, a phase locking circuit 41 and a control circuit 43, and the control circuit 43 is coupled to the frequency locking circuit 42 and the phase locking circuit 41. The phase frequency detector 30 is coupled to the phase recorder 50, the frequency phase locking circuit 40, and the divider 20. The oscillating circuit 10 is coupled to the control circuit 43 and the divider 20.

After an oscillating signal Sdco outputted from the oscillating circuit 10 is converted into the divided signal Sdiv by the division operation of the divider 20 and fed back to the phase frequency detector 30, the digital phase locked loop enters a detection mode. In the detection mode, the phase frequency detector 30 can detect the frequency difference Fd between the divided frequency of the divided signal Sdiv and the reference frequency of the reference signal Sref.

While detecting the frequency, the phase frequency detector 30 can detect the phase difference Pd between the divided phase of the divided signal Sdiv and the reference phase of the reference signal Sref Specifically, as shown in FIG. 4, the divided signal Sdiv and the reference signal Sref each include a plurality of consecutive square waves, but each square wave of the divided signal Sdiv has a phase different from the corresponding square wave of the reference signal Sref, for example, the phase difference Pd is formed between a rising edge of each square wave of the signal Sdiv and a rising edge of the corresponding square wave of the reference signal Sref. It should be understood that, ideally, if the divided signal Sdiv and the reference signal Sref are synchronous signals, the phase difference Pd is zero.

After the detection mode, the digital phase locked loop enters a frequency tracking mode as shown in FIG. 3. In the frequency tracking mode, the frequency locking circuit 42 can track the divided frequency of the divided signal Sdiv according to the frequency difference Fd detected by the phase frequency detector 30, and lock the divided frequency falling within a preset locked frequency range. As shown in FIG. 3, the frequency locking circuit 42 can output a low level lock signal Flocked, which represents a continuous tracking state in an unlocked state, and when the lock frequency signal Flocked turns from the low level to the high level, which represents that it is currently in a locked state.

When the control circuit 43 receives the high level lock frequency signal Flocked, the frequency locking circuit 42 can be controlled/notified to stop the frequency tracking operation. At this time, the control circuit 43 and/or the phase recorder 50 can record a lock time of the divided frequency.

After the frequency is locked, the digital phase locked loop then enters a phase recording mode. In the phase recording mode, the control circuit 43 may require the phase recorder 50 to record the phase difference Pd between the divided signal Sdiv and the reference signal Sref. For example, as shown in FIG. 4, the phase recorder 50 can record the phase difference Pd between a rising edge of a first square wave of the divided signal Sdiv and a rising edge of the corresponding square wave of the reference signal Sref in the phase recording mode, and the phase difference Pd is used as the tracking reference phase difference Ptb. The phase recorder state signal Pr shown in FIGS. 3 and 4 has the tracking reference phase difference Ptb after the phase difference Pd is recorded.

After the phase recording mode, the digital phase locked loop enters a phase tracking mode. A control signal Ctrl outputted by the control circuit 43 shown in FIG. 3 has a frequency lock code FLCode in the phase tracking mode, which means that the phase tracking operation is performed in a frequency lock state. When the control circuit 43 receives the tracking reference phase difference Ptb, the phase lock circuit 41 can be controlled to track the divided phase of the subsequent square wave of the divided signal Sdiv according to the tracking reference phase difference Ptb. When the divided phase of the tracked divided signal Sdiv falls within the locked phase range, the phase lock circuit 41 locks the divided phase that is tracked and outputs a corresponding phase lock signal Plocked.

Finally, the control circuit 43 can output the control signal Ctrl to the oscillating circuit 10 according to the frequency lock signal Flocked and the phase locking signal Plocked. Finally, the oscillating circuit 10 can output another oscillating signal.

Further, after the frequency locking and phase locking as described above, the frequency and phase of the oscillating signal outputted by the oscillating circuit 10 may be drifted due to factors such as temperature in the process and the environment, which causes the originally locked frequency and phase to be unlocked and de-asserted, respectively. In order to solve this problem, even if the frequency and the phase are locked, the frequency and phase of the divided waveform that are successively generated can be detected and re-locked with another frequency and another phase that are detected and tracked, and the details are as follows.

If the frequency is unlocked, perform the following operations of re-tracking and frequency locking, re-phase tracking, and phase locking. Specifically, when the divided frequency is changed, the phase frequency detector 30 will detect another frequency difference between the divided frequency and the reference frequency. Based on the other frequency difference, the frequency locking circuit 42 tracks the divided frequency again when the divided frequency that is tracked does not fall within the lock frequency range and is unlocked. Until the frequency locking circuit 42 determines that the divided frequency falls within the lock frequency range again, the frequency locking circuit 42 stops tracking and re-locks the divided frequency. When the frequency locking circuit 42 re-locks the divided frequency, another phase difference that is current detected by the phase frequency detector 30 between a rising edge of the another divided waveform and a rising edge of the corresponding reference waveform in the reference signal serves as another tracking reference to be recorded in the phase recorder 50. The phase lock circuit 41 can obtain another tracking reference phase difference from the phase recorder 50 and track the another divided waveforms of the divided signals in accordance with the another tracking reference phase difference. When the phase lock circuit 41 determines that the divided phase of the another divided waveform that is tracked falls within the lock phase range, the phase lock circuit 41 locks the divided phase that is tracked.

If the phase is unlocked, the following operations of re-phase tracking and phase locking are performed. Specifically, the phase frequency detector 30 detects another phase difference between the divided phase in that the divided waveform is changed and the corresponding reference waveform in the reference signal. The phase locking circuit 41 determines, according to the another phase difference, that the divided phase of the divided waveform that is currently tracked does not fall within the locked phase range and is unlocked, and the another phase difference is recorded as another tracking reference phase difference in the phase recorder. When the phase lock circuit 41 tracks, according to another tracking reference phase difference, that the divided phase of the other divided waveforms falling within the locked phase range, the phase locking circuit 41 re-locks the divided phase that is currently tracked.

Figure 5:
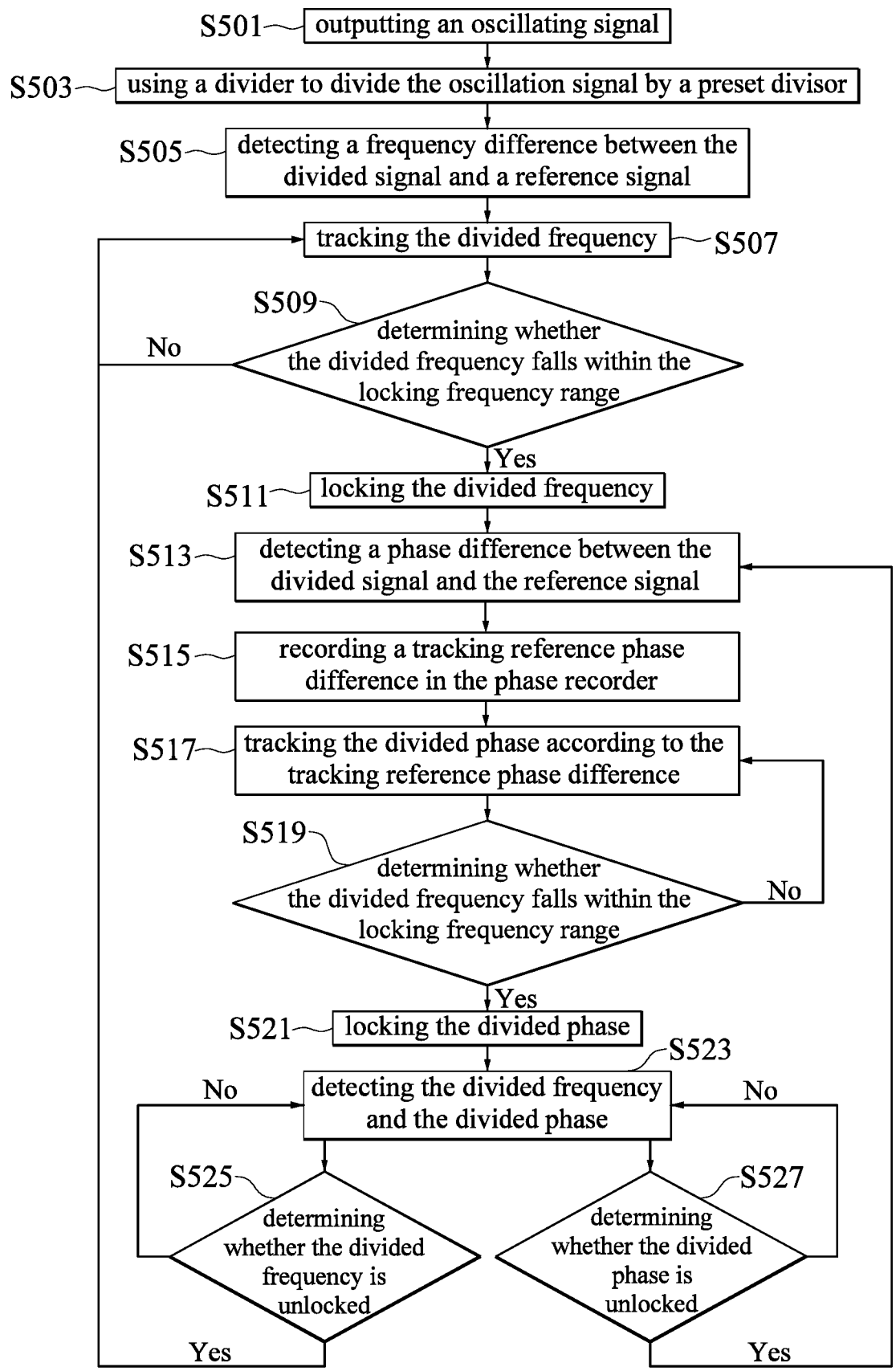
FIG. 5 is a flow chart showing the steps of the fast locking method applied to the digital phase locked loop according to a third embodiment of the present disclosure.

FIG. 5 is a flow chart showing the steps of the fast locking method applied to the digital phase locked loop according to a third embodiment of the present disclosure. The fast locking method of the third embodiment of the present disclosure is applicable to the above-mentioned digital phase locked loop, and the fast locking method includes the following steps S501~S527:

Step S501: outputting an oscillating signal by an oscillating circuit.

Step S503: using a divider to divide an oscillating frequency of the oscillation signal by a preset divisor to output a divided signal.

Step S505: using a phase frequency detector to detect a frequency difference between a divided frequency of the divided signal and a reference frequency of a reference signal.

Step S507: using a frequency phase locking circuit to track the divided frequency according to the frequency difference between the divided signal and the reference signal.

Step S509: using a frequency phase locking circuit to determine whether the divided frequency falls within the locking frequency range, if not, performing the step S507 again, if yes, the method proceed to step S511: using the frequency phase locking circuit to lock the divided frequency, and then performing step S513.

Step S513: using a phase frequency detector to detect a phase difference between a rising edge of one divided waveform of the divided signal and a rising edge of a corresponding reference waveform in the reference signal.

Step S515: using a phase recorder to record the phase difference as a tracking reference phase difference.

Step S517: using the frequency phase locking circuit to track, according to the tracking reference phase difference, the divided phase of other one or more divided waveform of the divided signal.

Step S519: using the frequency phase locking circuit to determine whether the divided frequency falls within the locking frequency range, if not, performing the step S517 again, if yes, performing step S521: using the frequency phase locking circuit to lock the divided phase that is tracked, and then performing step S523.

Step S523: Since the divided signal may drift due to temperature or one or more environmental factors, etc., the phase frequency detector is used to continuously detect the divided frequency and the divided phase of the divided signal, and the detections may be performed by using the above steps, or alternatively, a variation amplitude of the divided frequency/divided phase before and after the drift can be directly detected, and the next step S525 is performed accordingly.

Step S525: determining whether the divided frequency is unlocked, and if yes, steps S507 to S525 are re-executed, and if not, step S523 is continuously performed.

Step S527: determining whether the divided phase is unlocked, and if yes, steps S513 to S527 are re-executed, and if not, step S523 is continuously performed.

Advantages of the present disclosure is that, the fast-locking digital phase locked loop and a fast locking method thereof provided by the present disclosure, by recording a phase difference between a waveform of a divided signal (for example, the first waveform) obtained by dividing the oscillating signal output from the oscillating circuit by a preset divisor and the corresponding waveforms of the reference signal, and serves the phase difference as a reference for tracking the phase, so as to directly track the subsequent one or more waveforms of the divided signal according to the reference phase difference, thereby reducing the phase locking time and achieving the effect of fast phase locking regardless of the phase difference.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A fast-locking phase locked loop, comprising:
    an oscillating circuit outputting an oscillating signal;
    a divider coupled to the oscillating circuit, configured to divide the oscillating signal by a preset divisor to output a divided signal;
    a phase frequency detector coupled to the divider, configured to receive a reference signal and the divided signal, and detect a frequency difference between a divided frequency of the divided signal and a reference frequency of the reference signal, wherein the phase frequency detector is configured to detect a phase difference between a rising edge of one of a plurality of divided waveforms of the divided signal and a rising edge of a corresponding reference waveform in the reference signal;
    a frequency phase locking circuit coupled to the phase frequency detector, configured to receive the reference difference and track the divided frequency according to the reference difference, wherein when the divided frequency falls into a locking frequency range, the frequency phase locking circuit locks the divided frequency; and
    a phase recorder coupled to the phase frequency detector and the frequency phase locking circuit, wherein when the frequency phase locking circuit locks the divided frequency, the phase difference detected by the phase frequency detector serves as a tracking reference phase difference to be recorded in the phase recorder;
    wherein the frequency phase locking circuit is configured to track the other divided waveform after the divided waveform of the divided signal according to the tracking reference phase difference, and when the frequency phase locking circuit determines the divided phase of the divided waveform that is tracked falls within a locking phase range, the frequency phase locking circuit locks the divided phase that is tracked.

2. The fast-locking phase locked loop according to claim 1, wherein the frequency phase locking circuit includes:
    a frequency locking circuit coupled to the phase frequency detector, configured to receive the frequency difference and track the divided frequency according to the frequency difference, wherein when the divided frequency falls into a locking frequency range, the frequency locking circuit locks the divided frequency and outputs a corresponding lock frequency signal;
    a phase lock circuit coupled to the phase recorder, the phase lock circuit configured to receive the tracking reference phase difference, and track the divided signal according to the tracking reference phase difference, when the divided phase of the tracked signal falls within the locking phase range, the phase locking circuit locks the divided phase that is tracked and outputs a corresponding phase lock signal; and a control circuit coupled to the frequency locking circuit, the phase locking circuit, the phase recorder, and the oscillating circuit, when the control circuit receives the tracking reference phase difference from the phase recorder, the control circuit controls the phase locking circuit to perform tracking of the divided phase according to the tracking reference phase difference, the control circuit outputs the control signal to the oscillating circuit according to the lock frequency signal and the phase locking signal, and the oscillating circuit outputs another oscillating signal according to the lock frequency signal and the phase locking signal.

3. The fast-locking phase locked loop according to claim 1, wherein the phase frequency detector detects another frequency difference between the divided frequency that is changed and the reference frequency;

wherein when the divided frequency is unlocked after the divided frequency does not fall within the locking frequency range, the frequency phase locking circuit tracks the divided frequency again until the divided frequency falls within the locking frequency range again according to the another frequency difference, and re-locks the divided frequency;

wherein when the frequency phase locking circuit re-locks the divided frequency, the phase frequency detector detects another phase difference between a rising edge of the another divided waveform and a rising edge of a corresponding reference waveform in the reference signal as another tracking reference phase difference to be recorded in the phase recorder;

the frequency phase locking circuit tracks the another divided waveform according to the another tracking reference phase difference;

when the frequency phase locking circuit determines the another divided phase of the another divided waveform that is tracked falling within the locking phase range, the frequency phase locking circuit locks the another divided phase that is tracked.

4. The fast-locking phase locked loop according to claim 1, wherein the phase frequency detector detects another phase difference between the divided waveform in that the divided phase is changed and a corresponding reference waveform in the reference signal;

the frequency phase locking circuit determines, according to the another phase difference, that the divided phase of the divided waveform that is currently tracked does not fall within the locking phase range and is unlocked, and the another phase difference is used as another tracking reference phase difference to be recorded in the phase recorder;

when the frequency phase locking circuit tracks, according to the another tracking reference phase difference, that the divided phase of the other divided waveform falls within the locking phase range, the frequency phase locking circuit re-locks the divided phase that is currently tracked.

5. A fast locking method, comprising:

outputting an oscillating signal by an oscillating circuit;

using a divider to divide a oscillating frequency of the oscillation signal by a preset divisor to output a divided signal;

using a phase frequency detector to detect a frequency difference between a divided frequency of the divided signal and a reference frequency of a reference signal;

using a frequency phase locking circuit to track whether the divided frequency falls within the locking frequency range, if not, continuously tracking the divided frequency, if yes, using the frequency circuit to lock the divided frequency;

using a phase frequency detector to detect a phase difference between a rising edge of one divided wave form of the divided signal and a rising edge of a corresponding reference waveform in the reference signal;

using a phase recorder to record the phase difference as a tracking reference phase difference;

using the frequency phase locking circuit to track, according to the tracking reference phase difference, one or more divided waveform after the divided waveform of the divided signal; and using the frequency phase locking circuit to determine whether the divided phase of the divided waveform that is tracked falls within a locking phase range, if not, continuously tracking the divided phase, if yes, using the frequency phase locking circuit to lock the divided phase that is tracked.

6. The fast locking method according to claim 5, further including:

using the phase frequency detector to detect another phase difference between the divided waveform in that the divided phase is changed and a corresponding reference waveform in the reference signal;

using the frequency phase locking circuit to determine, according to the another phase difference, whether the divided phase of the divided waveform that is currently tracked does not fall within the locking phase range and is unlocked, if not, repeatedly performing previous step, if yes, serving the another phase difference as the another tracking reference phase difference to be recorded in the phase recorder;

using the frequency phase locking circuit to track, according to the another tracking reference phase difference, whether the divided phase of the other divided waveform falls within the locking phase range, if not, continuously tracking the divided phase of the other divided waveform, if yes, using the frequency phase locking circuit to re-lock the divided phase that is currently tracked.

7. The fast locking method according to claim 5, further including:

using the frequency phase locking circuit to track whether the divided phase that is tracked unlocks, if not, tracking whether the divided phase of the divided signal falls within the locking phase range, if yes, using the phase frequency detector to detect the another phase difference between a rising edge of one or more divided waveform of the divided signal and a rising edge of the corresponding waveform in the reference signal;

using the phase recorder to record the another phase difference currently detected by the phase frequency detector as the another tracking reference phase difference; and using the frequency phase locking circuit to track, according to the another tracking reference phase difference, that when the divided phase falls within the locking phase range, the frequency phase locking circuit locks the divided phase.

8. The fast locking method according to claim 5, further including:

using the phase frequency detector to detect another frequency difference between the divided frequency that is changed and the reference frequency;

using the frequency phase locking circuit to track, according to the another frequency difference, whether the divided frequency does not fall within the locking frequency range and is unlocked, if not, repeatedly performing previous step, if yes, tracking the divided frequency again until the divided frequency falls within the locking frequency range again, re-locking the divided frequency;

using the phase frequency detector to detect another phase difference between a rising edge of the another divided waveform and a rising edge of a corresponding reference waveform in the reference signal as another tracking reference phase difference to be recorded in the phase recorder;

using the frequency phase locking circuit to track the another divided waveform according to the another tracking reference phase difference;

using the frequency phase locking circuit to determine whether the another divided phase of the another divided waveform that is tracked falls within the locking phase range, if not, tracking the yet another divided phase of the yet another divided waveform, if yes, using the frequency phase locking circuit to lock the another divided phase that is tracked.

* * * * *